United States Patent
Wu et al.

(10) Patent No.: US 7,266,014 B2
(45) Date of Patent: Sep. 4, 2007

(54) METHOD OF OPERATING NON-VOLATILE MEMORY DEVICE

(75) Inventors: Chao-I Wu, Hsinchu (TW); Ming-Hsiu Lee, Hsinchu (TW)

(73) Assignee: MACRONIX International Co., Ltd, Hsinchu (TW)

( * ) Notice: Subject to any disclaimer, the term of this patent is extended or adjusted under 35 U.S.C. 154(b) by 46 days.

(21) Appl. No.: 11/161,359

(22) Filed: Aug. 1, 2005

(65) Prior Publication Data

US 2007/0025153 A1 Feb. 1, 2007

(51) Int. Cl.
*G11C 11/34* (2006.01)

(52) U.S. Cl. .......................... 365/185.01; 365/185.33; 365/185.29; 365/185.28; 365/185.26

(58) Field of Classification Search ........... 365/185.01, 365/185.33, 185.26, 185.28, 185.29
See application file for complete search history.

(56) References Cited

U.S. PATENT DOCUMENTS

| | | | | |
|---|---|---|---|---|
| 5,349,221 A | * | 9/1994 | Shimoji | 257/324 |
| 6,011,725 A | | 1/2000 | Eitan | 365/185.33 |
| 6,487,114 B2 | | 11/2002 | Jong et al. | 365/185.33 |
| 6,862,221 B1 | * | 3/2005 | Melik-Martirosian et al. | 365/185.29 |

OTHER PUBLICATIONS

Article titled "PHINES: A Novel Low Power Program/Erase, Small Pitch, 2-Bit per Cell Flash Memory" offered by Yeh et al. in 2002, *IEEE*, pp. 931-934.
Article titled "NROM: A Novel Localized Trapping, 2-Bit Non-volatile Memory Cell" offered by Eitan et al. in 2000, IEEE, pp. 543-545.

* cited by examiner

*Primary Examiner*—Anh Phung
*Assistant Examiner*—Pho M. Luu
(74) *Attorney, Agent, or Firm*—Jianq Chyun IP Office

(57) ABSTRACT

A method of operating a non-volatile memory is provided, wherein the non-volatile memory at least includes: a gate structure formed by stacking a tunneling dielectric layer, charge trapping layer, a dielectric layer and a gate conducting layer sequentially, and a source region and a drain region. When the operating method is carried out, a ultra-violet is irradiated to the non-volatile memory to inject electrons into the charge trapping layer to erase the non-volatile memory, and a negative voltage is applied to the gate conductive layer and a positive voltage is applied to the drain region to program the non-volatile memory by band-to-band induced hot hole injection.

16 Claims, 3 Drawing Sheets

METHOD OF OPERATING NON-VOLATILE MEMORY DEVICE

BACKGROUND OF THE INVENTION

1. Field of the Invention

The present invention generally relates to an operation method for a non-volatile memory. More particularly, the present invention relates to an operation method for a non-volatile memory under low voltage.

2. Description of Related Art

The erasable and programmable read only memory (EPROM) and the electrically erasable programmable read only memory (E2PROM) are classified to be the non-volatile memory during the application of the integrated circuit. Where the electrical erasable and programmable read only memory contains the advantages includes writable, erasable, retaining the data even after the electricity is terminated, therefore, it is well accepted memory device to be applied for personal computers and electrical equipments.

According to the current development of the non-volatile memory devices, the one with electrical trapping structure can be, for example, Silicon-Oxide-Nitride-Oxide-Silicon (SONOS), Metal-Oxide-Nitride-Oxide-Silicon (MONOS) . . . etc, the electron trapping layer where the electron can fill in restricted area and less defected sensitivity to the tunneling oxide layer, therefore less possibility for current leakage and one memory cell can save 2 bit, therefore better efficiency for the device can be expected.

In general, the operation method for the above mentioned read only memory which contains the electron trapped layer is, for example, programming by the channel hot electron injection (CHEI) and erasing the data through the band to band induced hot hole injection, or by Flower-Nordheim tunneling (FN Tunneling) to fill electron into the electron trapping layer for erasing and programming by band to band induced hot electron injection.

According to the above mentioned operation method, 10 volts are required for the controlling gate to perform the programming by channel hot electron injection; and 20 volts are required for the controlling gate if performing the erasing through FN tunneling; therefore the tolerance for the high voltage is required for the electron trapping layer of the read only memory. However, if the electron trapping layer of the read only memory is requested to be with high voltage tolerance, considering the fabrication for the integration of the peripheral electrical circuit, the fabrication of the memory device, will be more complicated, therefore, the cost will be increased.

SUMMARY OF THE INVENTION

Accordingly, the present invention is directed to an operation method of a non-volatile memory which can be performed under the lower voltage, therefore, there no need to apply the high voltage device.

In accordance with one aspect of the present invention, a simplified fabrication of the memory device and the design of the electrical circuit for a non-volatile memory operation is provided.

According to the present invention of the operation for the non-volatile memory, the non-volatile memory is at least comprised ofd a gate structure, where the gate structure is further comprised of a tunneling dielectric layer, a charge trapping layer, a dielectric layer and a gate conducting layer accordingly. The previous mentioned gate structure is located between the two sides of the source and drain regions inside the substrate. While the non-volatile memory performs the erasing process, a ultraviolet (UV) is projected to the non-volatile memory to enable the electron filling into the charge trapping layer in order to erase the non-volatile memory. While the non-volatile memory performs the programming, a negative voltage is added on the gate conducting layer and a positive voltage is added on the drain region to start the band to band induced hot hole injection for the programming process.

As the above mentioned operation method for the non-volatile memory, where the charge trapping layer further contains a first electron trapping site and a second electron trapping site, the programming process is either performed on the first charge trapping site or the second charge trapping site. The reading process is at least carried on either the programmed the first charge trapping site or the second charge trapping site. According to the programmed status of the charge trapping sites, the first charge trapping site will present either 0 or −1 (1 bite) status; similarly, the second charge trapping site can present either 0 or −1 (1 bite) status depended on its programmed status; therefore, this non-volatile memory can demonstrate the 2-bite operation method.

Accordingly, the present invention is directed to another operation method of a non-volatile memory, where the wherein the non-volatile memory at least includes: a gate structure formed by stacking a tunneling dielectric layer, charge trapping layer, a dielectric layer and a gate conducting layer sequentially, and a source region and a drain region. When the operating method is carried out, a ultraviolet is irradiated to the non-volatile memory to inject electrons into the charge trapping layer to erase the non-volatile memory, and a negative voltage is applied to the gate conductive layer and a positive voltage is applied to the drain region to program the non-volatile memory by band-to-band induced hot hole injection, where the charge trapping layer further containing a first trapping site and the second trapping site. While programming the non-volatile memory, only one of the first trapping site and the second trapping site will be programmed, and read only the pro-grammed charge trapping site which is either the first trapping site or the second trapping site.

Accordingly, the present invention is again directed to another operation method of a non-volatile memory, where the non-volatile memory at least contains sequentially stacked tunneling dielectric layer, a charge trapping layer, a dielectric layer and a gate structure formed by gate conducting layer, and a source region and a drain region. While erasing the non-volatile memory through the operating method, a ultraviolet (UV) is projected to the non-volatile memory to enable the electron filling into the charge trapping layer in order to erase the non-volatile memory. While the non-volatile memory performs the programming, a negative voltage is added on the gate conducting layer and a positive voltage is added on the drain region to start the band to band induced hot hole injection for the programming process; where the charge trapping site is further containing a first electron trapping site and a second electron trapping site. During the programming process for the non-volatile memory, the programming process is carried on both the first trapping site and the second trapping site, and the reading process is fixed on either the first trapping site or the second trapping site.

As the above mentioned operation method for the non-volatile memory, the non-volatile memory can be a one bit memory cell of the non-volatile memory.

As the above mentioned operation method for the non-volatile memory, the non-volatile memory can be a two bits memory cell of the non-volatile memory.

As the above mentioned operation method for the non-volatile memory, the non-volatile memory can be a three bits memory cell of the non-volatile memory.

As the above mentioned operation method for the non-volatile memory, the non-volatile memory can be a four bits memory cell of the non-volatile memory.

In conclusion of the above mentioned statements for the operation method of the non-volatile of the present invention, the erasing process applies the ultraviolet irradiation and the programming process applies the band to band induced hot hole injection, therefore, there is no requirements for the high voltage to be applied through the erasing or programming processes and no requests for the high voltage devices.

In addition, due to no requirements of the high voltage devices, the fabrication for the memory cell devices region can be easily integrated with peripheral electrical circuit, therefore, the fabrication of the memory device and design of the electrical circuit can be easily integrated for the non-volatile memory.

The following embodiments with accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
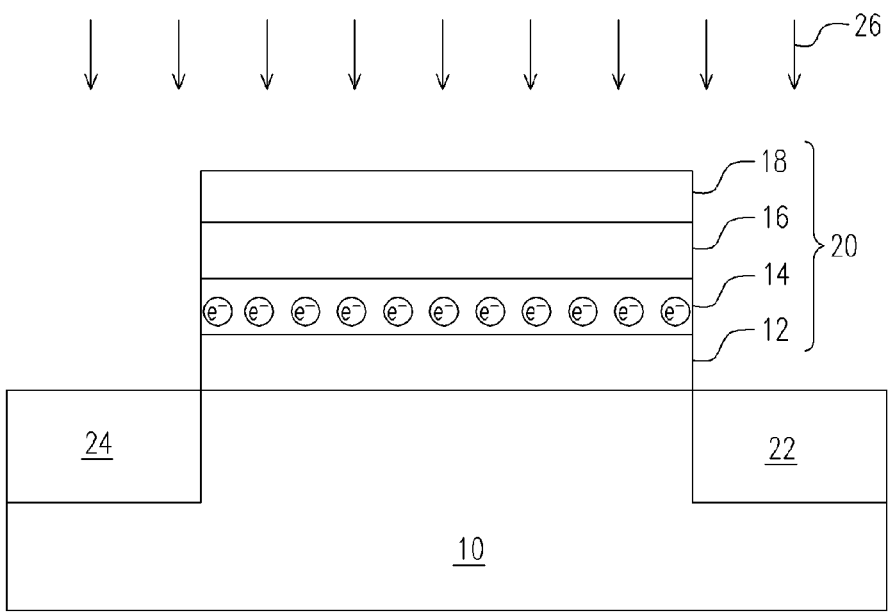
FIG. 1 is a schematic diagram illustrating the erasing process for the present invention of the non-volatile memory cell.
Figure 2:
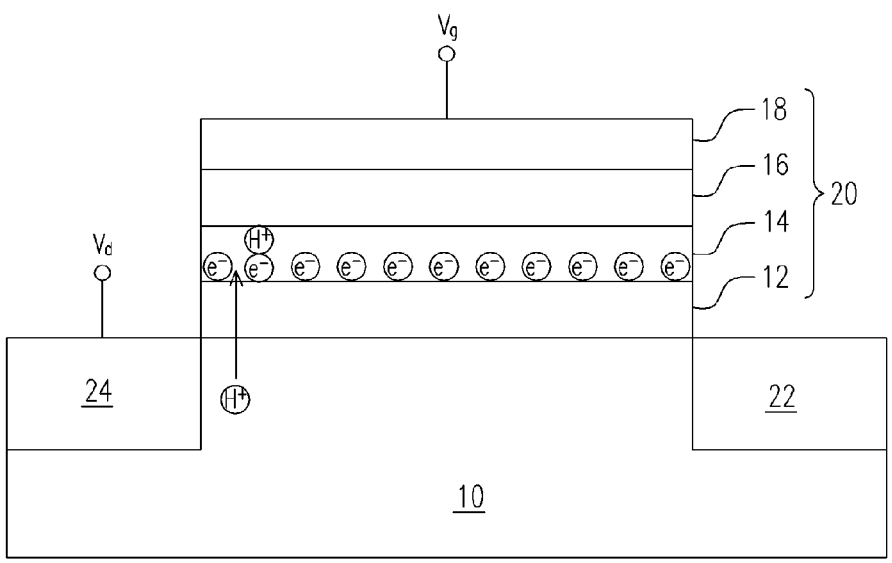
FIG. 2 is a schematic diagram illustrating the programming process for the present invention of the non-volatile memory cell.

The illustration of FIG. 1 and FIG. 2 are the operating method for the non-volatile memory of the present invention, where FIG. 1 illustrates the erasing process for the non-volatile memory of the present invention and the FIG. 2 illustrates the programming process for the non-volatile memory of the present invention.

Referring to FIG. 1, according to the embodiment of the present invention, the non-volatile memory cell comprises at least, a tunneling dielectric layer 12, a charge trapping layer 14, a dielectric layer 16, a gate conducting layer 18, a source region 22 and drain region 24. Where the material for the tunneling dielectric layer 12 is, for example, silicon oxide; the material for the charge trapping layer 14 is, for example, silicon nitride; the material for the dielectric layer 16 is, for example, silicon oxide; and the material for the gate conducting layer 18 is, for example, polysilicon. The tunneling dielectric layer 12, the charge trapping layer 14, the dielectric layer 16 and the gate conducting layer 18 is stacked accordingly to form the gate structure 20, and the source region 22 and drain region 24 is located between the two sides of the gate structure 20.

Continuing referring to FIG. 1, the erasing process for the present invention of the non-volatile memory, the ultraviolet irradiates to enable the electron filling into the charge trapping layer 14 to reach the high voltage level, the other ultraviolet radiation is performed during the fabrication of the read only memory. It is worthwhile to be noticed, as the present invention applies the ultraviolet radiation to perform the erasing, therefore, comparing with the conventional high voltage operation, for example, FN tunneling for erasing process, there will be no requirements for the high voltage process to perform erasing.

Next, turning to FIG. 2, a negative voltage Vg is applied to the gate conducting layer 18 of the read only memory and a positive voltage Vd is applied to the drain region 24 for the programming process to enable the hole filled into the charge trapping layer 14 under the low-Vt level. Where the difference between the negative voltage Vg applied to the gate conducting layer 18 and the positive voltage Vd applied to the drain region 24 is enough to allow the band to band induced hot hole injection happened to perform programming. The voltage Vg applied to the gate conducting layer 18 is, for example, around −5 volt and the positive voltage Vd applied to the drain region 24 is, for example, around +5 volts.

While applying the band to band induced hot hole injection for programming, the overlapping of the gate conducting layer 18 and the drain region 24 generates the deep depletion and band to band tunneling; and due to the high electric field which is vertical (−Vg) and horizontal (Vd) to the tunneling dielectric layer 12, the hole which is inside the drain region 24 can pass the energy barrier of the tunneling dielectric layer 12 into the charge trapping layer 14. During this programming mechanism, the voltage difference between the Vg placed on the gate conducting layer 18 and the Vd placed on the drain region will not open the passage of the read only memory.

In the similar manner, as the programming is performed by the band to band induced hot hole injection for the present invention, comparing the conventional programming which applied the tunnel hot electron injection under high voltage, the present invention can perform programming under lower voltage which is one of the advantages.

Figure 3:
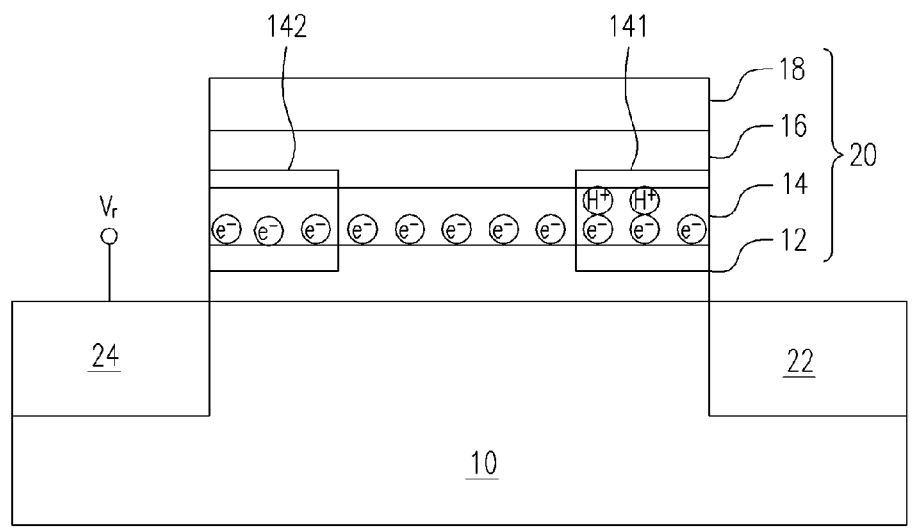
FIG. 3 is a schematic diagram illustrating the one side program and one side read method for the present invention of the non-volatile memory cell.

Besides, the operation method for the read only memory of the present invention can be further integrated with the following reading method for the operation processes. FIG. 3 illustrates the one-side program and one side read method for the non-volatile memory. FIG. 1 and FIG. 2 share the same labeling with FIG. 3 for the same devices to save further descriptions. Referring to FIG. 3, FIG. 3 illustrated the non-volatile memory which uses the erasing method described in FIG. 1 and the programming method described in FIG. 2, therefore, there is no requirement for the high voltage to process operation. In FIG. 3, the charge trapping layer 14 contains a first trapping site 141 and a seconds charge trapping site 142, noteworthy to be paid attentions is that the programming is only carried on either the first charge trapping site 141 or the seconds charge trapping site 142, and the reading process is only performed on the one programmed. As shown in FIG. 3, when only a first charge trapped site 141 is programmed, the read back voltage (Vr) is placed on the drain region 24 to perform the reading for the first charge trapping site 141. In addition, although not shown in FIG. 3, the programming can also be performed only on the second charge trapping site 142, the read back voltage can be placed on the source region 22 to read only the second charge trapping site 142.

Figure 4:
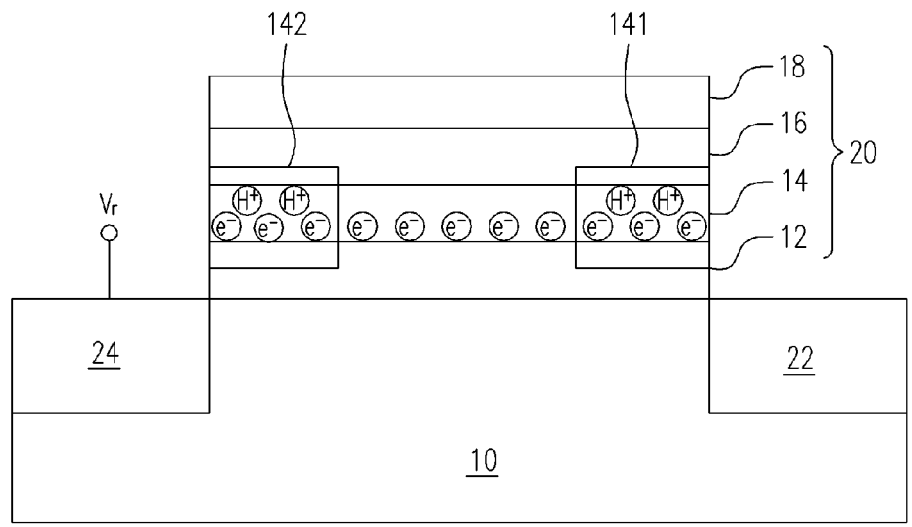
FIG. 4 is a schematic diagram illustrating the two sides program and one side read method for the present invention of the non-volatile memory cell.

Turing to FIG. 4, FIG. 4 illustrates the method of the two-side program, one-side read for the non-volatile memory. FIG. 4 shares the same labeling with FIG. 1 and FIG. 3, descriptions with the same labeling will be waived. The operation difference between the FIG. 3 and FIG. 4 is during the programming for the read only memory, the first charge trapping site 141 and the second charge trapping site 142 are programmed at the same time and consistently reading one fixed charge trapping site which can be either the first charge trapping site 141 or the second charge trapping site 142. As shown in the FIG. 4, the first charge trapping site 141 and the second charge trapping site 142 of the read only memory are programming at the same time; for the reading, a fixed voltage Vr is placed on the drain region 24 to read the first charge trapping site 141 (the fixed voltage Vr can also be placed on the source region 22 to read the second charge trapping site 142).

Besides, the above mentioned operation method for the one side program—one side read and the two side program—two side read of the present invention, can be, for example, decided upon the number of the filled charges to be further applied for one bit/memory cell, two bit/memory cell, three bit/memory cell and four bit/memory cell . . . etc of the multiple-level-cell (MLC) for the read only memory.

Figure 5:
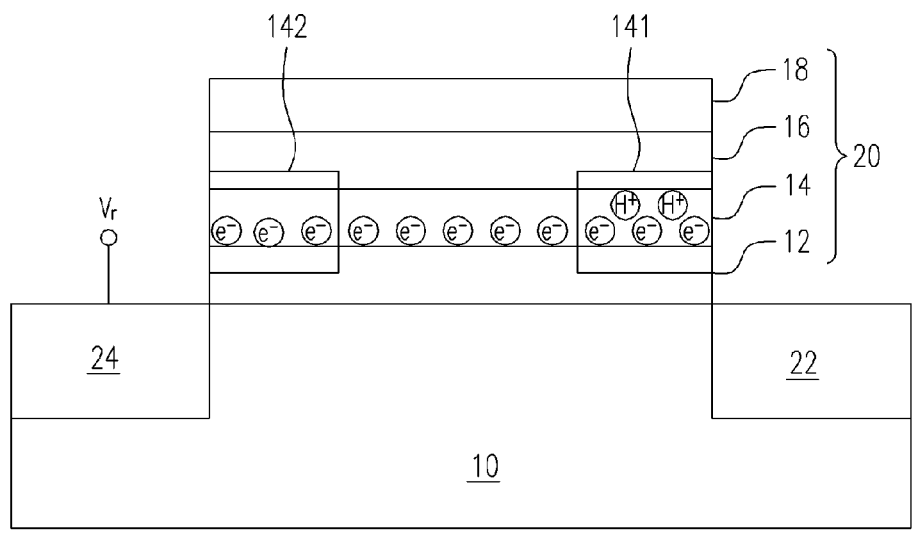
FIG. 5 and FIG. 6 are the schematic diagrams illustrating the reverse read method for the present invention of the non-volatile memory cell.
Figure 6:
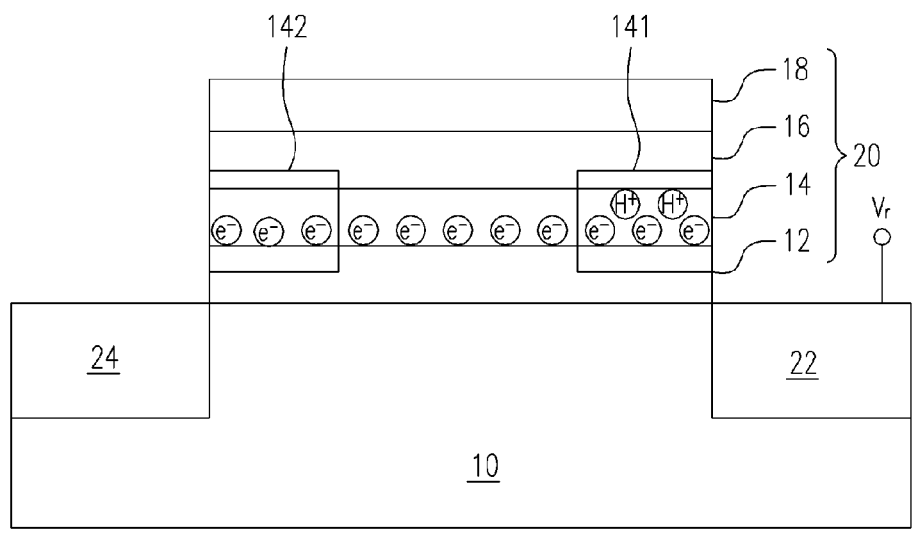

Next turning to FIG. 5 and FIG. 6, FIG. 5 and FIG. 6 illustrated the reverse read method of the non-volatile memory. FIG. 5 and FIG. 6 share the same labeling with FIG. 1 to FIG. 4 to waive the same description. FIG. 5 and FIG. 6 are the same read only memory which is erased and programmed through the same steps, however, the differences between the FIG. 5 and FIG. 6 are the different storage site for read charges. As shown in FIG. 5, while the reading is performed on the read only memory, the read back voltage Vr is placed on the drain region 24 to perform the reading at the first charge site 141. In the other way, the read only memory can also perform the reading by placing the read back voltage on the source region 22 to read the second charge trapping site 142 as shown in FIG. 6.

According to the above mentioned embodiments, the operation method for the non-volatile memory of the present invention applied the ultraviolet radiation to perform the erasing process and the band to band induced hot hole injection to perform the programming process, therefore, the operation method for the present invention requires no high voltage for the erasing process or the programming process, and there is no high voltage devices demand for the non-volatile memory of the present invention.

Furthermore, as there is no high voltage devices demand for the non-volatile memory of the present invention, the fabrication of the memory cell device region and the peripheral circuit device region cab be easily integrated, thereby, the fabrication of the non-volatile memory devices and the design of the electrical circuit are simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation method for a non-volatile memory, wherein the non-volatile memory comprising at least:

a tunnel dielectric layer, a charge trapping layer, a dielectric layer and a gate conducting layer are stacked accordingly to form a gate structure; a source region and a drain region, and the method is further comprised of steps as following:

an ultraviolet radiation is projected to the non-volatile memory to perform an erasing process which allows electrons to fill into the charge trapping layer and erase the non-volatile memory; and a negative voltage is placed on the gate conducting layer and a positive voltage is placed on the drain region to simulate band to band induced hot hole injection for a programming process of the non-volatile memory, wherein the difference between the positive voltage and the negative voltage is not enough to open a passage region of the non-volatile memory.

2. The operation method for a non-volatile memory as recited in claim 1, wherein the charge trapping layer is further comprised of a first charge trapping site and a second charge trapping site; at least one of the first charge trapping site and the second charge trapping site will be read during a reading process of the non-volatile memory.

3. The operation method for a non-volatile memory as recited in claim 1, wherein the non-volatile memory is a one bit/memory cell of the non-volatile memory.

4. The operation method for a non-volatile memory as recited in claim 1, wherein the non-volatile memory is a second bits/memory cell of the non-volatile memory.

5. The operation method for a non-volatile memory as recited in claim 1, wherein the non-volatile memory is a three bits/memory cell of the non-volatile memory.

6. The operation method for a non-volatile memory as recited in claim 1, wherein the non-volatile memory is a four bits/memory cell of the non-volatile memory.

7. An operation method for a non-volatile memory, wherein the non-volatile memory comprising at least:

a tunnel dielectric layer, a charge trapping layer, a dielectric layer and a gate conducting layer are stacked accordingly to form a gate structure; a source region and a drain region, and the method is further comprised of steps as following:

an ultraviolet radiation is projected to the non-volatile memory to perform an erasing process which allows electrons to fill into the charge tapping layer and erase the non-volatile memory; and a negative voltage is placed on the gate conducting layer and a positive voltage is placed on the drain region to simulate band to band induced hot hole injection for a programming process of the non-volatile memory, wherein the charge trapping layer is further comprised of a first charge trapping site and a second charge trapping site; only one of the first charge trapping site and the second charge trapping site will be programmed during the programming process of the non-volatile memory, and only the programmed charge trapping site will be read; and the difference between the positive voltage and the negative voltage is not enough to open a passage region of the non-volatile memory.

8. The operation method for a non-volatile memory as recited in claim 7, wherein the non-volatile memory is a one bit/memory cell of the non-volatile memory.

9. The operation method for a non-volatile memory as recited in claim 7, wherein the non-volatile memory is a second bits/memory cell of the non-volatile memory.

10. The operation method for a non-volatile memory as recited in claim 7, wherein the non-volatile memory is a three bits/memory cell of the non-volatile memory.

11. The operation method for a non-volatile memory as recited in claim 7, wherein the non-volatile memory is a four bits/memory cell of the non-volatile memory.

12. The operation method for a non-volatile memory as recited in claim 7, wherein the non-volatile memory is a four bits/memory cell of the non-volatile memory.

13. An operation method for a non-volatile memory, wherein the non-volatile memory comprising at least:
  a tunnel dielectric layer, a charge trapping layer, a dielectric layer and a gate conducting layer are stacked accordingly to form a gate structure; a source region and a drain region, and the method is further comprised of steps as following:
  an ultraviolet radiation is projected to the non-volatile memory to perform an erasing process which allows electrons to fill into the charge trapping layer and erase the non-volatile memory; and
  a negative voltage is placed on the gate conducting layer and a positive voltage is placed on the drain region to simulate-the hand to band induced hot hole injection for a programming process of the non-volatile memory, wherein
  the charge trapping layer is further comprised of a first charge trapping site and a second charge trapping site; both the first charge mapping site and the second charge trapping site will be programmed during the programming process of the non-volatile memory, and only one fixed programmed charge trapping site will be read; and the difference between the positive voltage and the negative voltage is not enough to open the passage region of the non-volatile memory.

14. The operation method for a non-volatile memory as recited in claim 13, wherein the non-volatile memory is a one bit/memory cell of the non-volatile memory.

15. The operation method for a non-volatile memory as recited in claim 13, wherein the non-volatile memory is a second bits/memory cell of the non-volatile memory.

16. The operation method for a non-volatile memory as recited in claim 13, wherein the non-volatile memory is a three bits/memory cell of the non-volatile memory.

* * * * *